United States Patent [19]

Bottom

[11] 4,130,771
[45] Dec. 19, 1978

[54] METHOD OF ADJUSTING THE FREQUENCY OF A CRYSTAL RESONATOR AND REDUCING AGEING EFFECTS

[75] Inventor: Virgil E. Bottom, Abilene, Tex.

[73] Assignee: Tyco Crystal Products, Inc., Phoenix, Ariz.

[21] Appl. No.: 805,072

[22] Filed: Jun. 9, 1977

Related U.S. Application Data

[63] Continuation of Ser. No. 658,523, Feb. 17, 1976, abandoned.

[51] Int. Cl.² ............................................. H01L 41/22
[52] U.S. Cl. ..................................... 310/312; 310/363
[58] Field of Search .............. 310/312, 320, 363, 364; 29/25, 35

[56] References Cited

U.S. PATENT DOCUMENTS

| 2,101,893 | 12/1937 | Bokovoy et al. ............... 310/364 X |
| 3,401,276 | 9/1968 | Curran et al. ....................... 310/320 |

FOREIGN PATENT DOCUMENTS 1185819  3/1970  United Kingdom.

*Primary Examiner*—Mark O. Budd
*Attorney, Agent, or Firm*—Harry M. Weiss

[57] ABSTRACT

A method is provided for adjusting the resonant frequency of an aluminum plated quartz resonator so as to reduce the effect of aging. The method comprises initially forming the aluminum plated resonator so that its frequency is above the nominal frequency, and then reducing the frequency to the nominal value by anodically forming an oxide film with a thickness in excess of 50Å on the aluminum plating.

11 Claims, 5 Drawing Figures

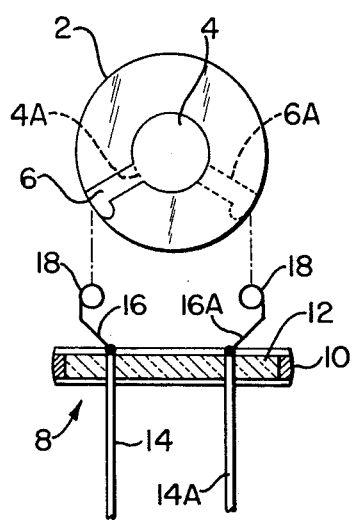
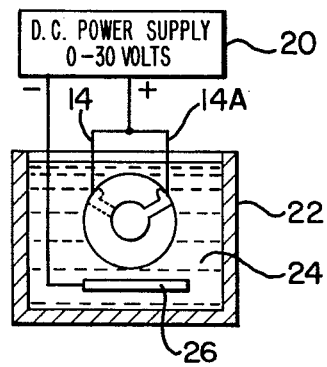
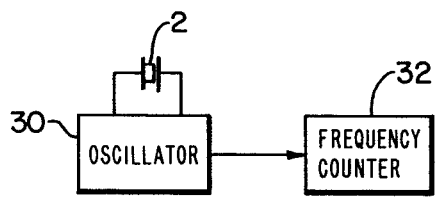
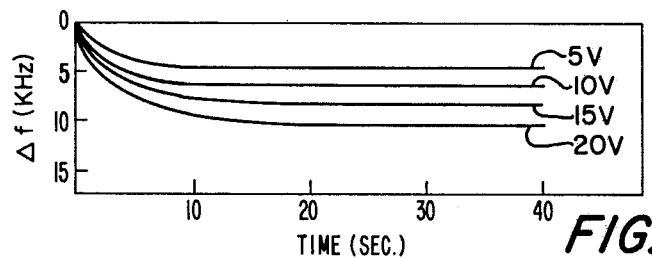
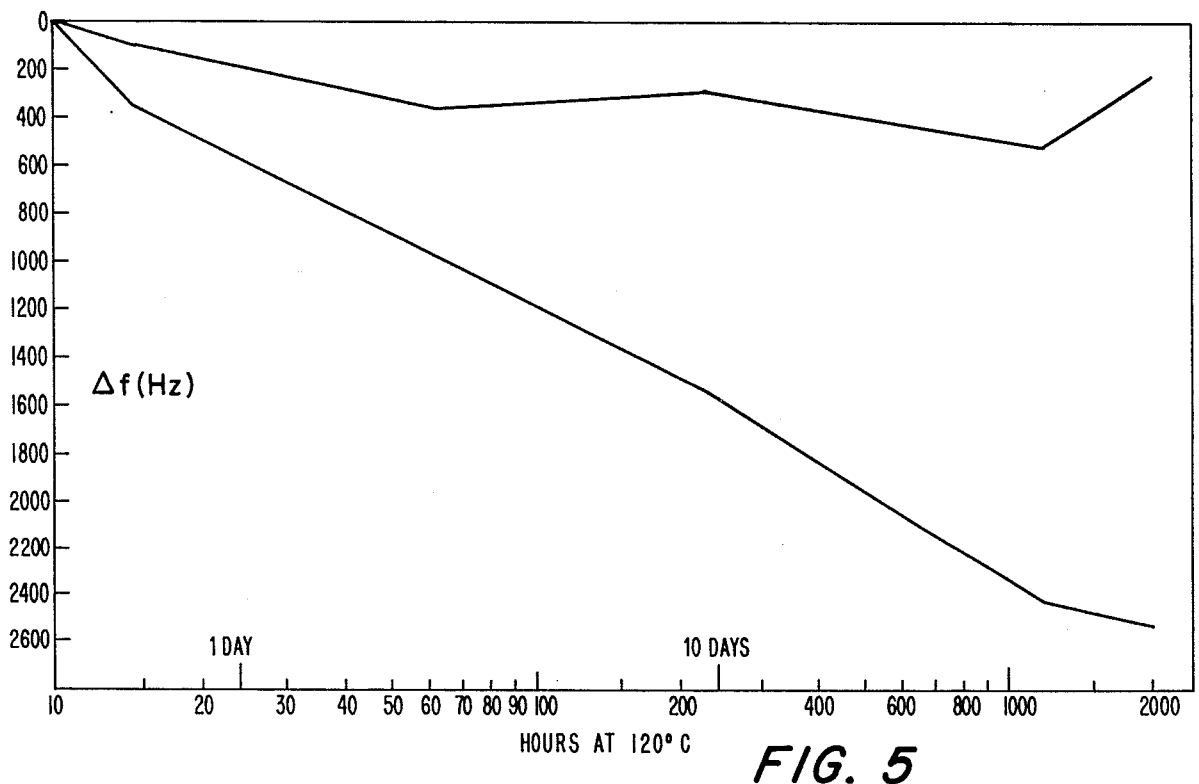

METHOD OF ADJUSTING THE FREQUENCY OF A CRYSTAL RESONATOR AND REDUCING AGEING EFFECTS

This application is a continuation of my copending application Ser. No. 658,523 filed Feb. 17, 1976 for Method of Adjusting the Frequency of a Crystal Resonator, now abandoned.

This invention relates to piezoelectric crystals and more particularly to a process for controllably adjusting the frequency of a piezoelectric crystal unit and other devices.

A piezoid is a piece of piezoelectric crystal which is cut to have the form of a plate, a bar or some other geometric shape. A piezoelectric crystal unit is a unit which embodies a piezoid and is adapted to function as an electronic device, e.g., as a crystal resonator for a crystal controlled oscillator or as a crystal filter (see D. G. Fink, Electronic Engrs. Handbook, First Ed. pp. 7-62 to 7-65, McGraw-Hill 1975). In using a piezoelectric crystal unit, an electric field is applied to the piezoid by means of metallic electrodes which are usually deposited on the surface of the crystal.

Piezoelectric resonators intended for operation at high and very high frequencies usually comprise thin single crystal plates of quartz with aluminum electrodes deposited on the major surfaces. The aluminum electrodes serve two purposes: (1) to provide contacts whereby an electric field may be applied to the crystal and (2) to adjust the resonant frequency. Aluminum is preferred over other metals for the electrodes of VHF resonators because its acoustic properties match those of quartz more closely than any other metal and because of its durability resulting from the protection provided by the oxide which naturally forms on its surfaces.

However, problems exist with respect to providing quartz crystal resonators of selected resonant frequency on a mass production basis. When a freshly prepared aluminum surface is first exposed to air, an oxide film begins to form on the surface. At normal room temperature and humidity, the film grows to a thickness of about 10Å after about 2 hours and reaches a maximum thickness of about 50Å in about 1 month, with half of this growth occuring in the first 2 days (see G. Haas, On the Preparation of Hard Oxide Films, J.O.S.A. 39,532, 1949; and Mott and Gurney Electronic Processes in Ionic Crystals, Oxford Press, Second Edition, p. 262). The oxide film tends to reduce the resonant frequency of the crystal. Thus, the creation of an oxide film with a thickness of about 20Å on each of the two electrodes of a 47 mhz. third overtone AT-cut quartz resonator reduces the resonant frequency by about 1 khz. Since the natural oxide will grow in air to a maximum thickness of about 50Å, the frequency of a freshly made 47 mhz resonator may be expected to decrease by about 2.5 khz. due to oxide formation. At room temperature half of this change occurs in the first 2 or 3 days. At 100° C. half of its occurs in about 24 hours. This increases in the thickness of the oxide film and the attendant change in resonant frequency is called "aging". Aging is common to most electrode materials but is a particularly large factor for aluminum. Once the oxide has formed, the frequency is stable. However, because the rate of growth of natural oxide is dependent on ambient conditions, the production of crystal resonators has been complicated by the inability to rapidly, precisely and conveniently control and stabilize the resonant frequency. Heat treatment in air at temperatures below about 300° C. to stabilize the frequency is useless and too time consuming. Above 300° C. the rate of oxide growth in air increases with temperature and at about 450° C. the rate of growth is about twice that at room temperature. The rate of growth at any temperature is increased by an increase in humidity. However, the oxide films produced by heat treatment in air are rough and non-uniform and the temperatures required for significant oxide growth, i.e., annealing, in relatively short times are too high for practical use with quartz resonators.

Heretofore it has been the practice to adjust the frequency or crystal resonators by plating the aluminum contacts with silver. However, plating with silver and anything else done prior to this invention to adjust the frequency has resulted or tended to result in a new cycle of aging. The silver plating also tends to affect acoustic impedances.

Based on the knowledge that the natural oxide ceases to grow on aluminum when it reaches a thickness of about 50Å, after which the frequency changes are very small, the primary object of this invention is to deliberately and quickly increase the thickness of the oxide to at least 50Å and to use the thickness of the oxide to adjust and control the frequency of a quartz resonator.

Another object is to provide a method of quickly and controllably forming an oxide layer on an aluminum electrode of a crystal resonator and to use such oxide to adjust and stabilize the resonant freqency of the resonator.

A more specific object is to provide a method of adjusting the frequency of a crystal resonator having contacts made of one metal without the need to apply another metal to the contacts.

Still another object is to provide a method of treating the aluminum electrodes of a crystal resonator so as to achieve frequency stabilization without introducing any discontinuity of acoustic impedances or disturbing the geometry or symmetry of the resonator or requiring expensive new apparatus or extensive modification of the method of manufacturing such devices.

A further object is to provide improved crystal resonators.

These and other objects are achieved by employing anodic oxidation to deliberately and quickly produce an oxide layer on the aluminum electrode of a crystal resonator, with the thickness of the oxide layer being thick enough so that substantially no further oxide growth (and the attendant aging) may be expected. The oxide layer is used to adjust the frequency of the resonator to within predetermined limits.

Other features and many of the attendant advantages of the invention are set forth in or rendered obvious by the following detailed description which is to be considered together with the accompanying drawings wherein:

FIG. 1 is a perspective view of a quartz crystal resonator with aluminum contacts for use in a crystal controlled oscillator;

FIG. 2 is a schematic circuit design of an arrangement for producing oxide layers on the aluminum contacts of the resonator of FIG. 1;

FIG. 3 schematically illustrates equipment for measuring the resonant frequency of a crystal unit;

FIG. 4 is a family of curves illustrating the changes of frequency of a selected crystal resonator against the time for different anodizing voltages; and FIG. 5 is a graph showing the results of aging for crystal resonators produced in accordance with this invention and also according to the prior art.

It is well known that an oxide layer can be formed on an aluminum surface and that the thickness of an existing oxide layer can be increased by anodic oxidation (see L. I. Maissel et al, Handbook of Thin Film Technology, McGraw-Hill, pp. 5-17 to 5-20, 1970). Both porous and non-porous oxide surfaces are known, but this invention is concerned with non-porous oxide layers. Additionally, in the practice of this invention the anodic oxide coatings are required to be formed in electrolytes which are incapable of dissolving the oxide layers. Films formed by anodic oxidation in such electrolytes have the following interesting properties: (1) they are non-porous, (2) they are anhydrous (contain no water), (3) the film thickness is proportional to the applied voltage (approximately 14Å per volt) and (4) the thickness of the film is uniform and can be controlled to a predetermined value. Since growth of the naturally forming oxide substantially ceases when it has reached a thickness of about 50Å, after which frequency changes are quite small, the present invention contemplates increasing the thickness of the oxide to at least 50Å by anodic oxidation and to use such oxide to adjust the frequency of a crystal resonator. In this way a quartz resonator will have only aluminum and aluminum oxide deposited on its surface and the protective oxide layer is thick enough so that substantially no further oxide growth (and the attendant aging) may be expected. Experience has demonstrated that the frequency changes of VHF quartz crystal resonators made in accordance with the present invention show substantially no aging after the freqency has been adjusted as compared with units whose frequencies have been adjusted using other methods such as overplating with silver.

The process of adjusting the frequency of a crystal resonator by anodic oxidation essentially comprises (1) initially providing a crystal unit, with aluminum electrodes, having a resonant frequency which is slightly greater than the nominal frequency $f_r$, i.e., the frequency to which the unit is to be finally adjusted, and (2) then reducing the frequency to the nominal frequency $f_r$ by anodic oxidation. Step (1) involves forming a selected crystal blank, e.g., an AT-cut quartz plate, which it is known will have a resonant frequency above the nominal frequency if activated piezoelectrically, and plating the selected crystal blank with aluminum contacts by a suitable method such as evaporation deposition or sputtering so as to reduce the resonant frequency to a level slightly greater than the nominal frequency $f_r$. Since no two crystals are exactly alike and since the amount of aluminum plated may not be exactly correct, the frequency of the crystal unit after aluminum plating may be slightly below rather than slightly above the nominal frequency. In such case the frequency of the unit is raised to a point slightly above the nominal frequency by etching away some of the aluminum. Various etchants may be used for this purpose and the etching may be accomplished in various ways. The etchant must be capable of dissolving away the aluminum but must be inert with respect to the crystal material. Preferably the etchant comprises a dilute solution of potassium hydroxide, sodium hydroxide or ammonium hydroxide, or a mixture thereof, and the etching is accomplished by dipping the crystal units in the etchant for a predetermined period calculated to achieve the desired amount of frequency change. Thereafter the frequency is reduced to the nominal frequency by anodic oxidation. The latter is achieved by making the aluminum contacts the anode in an electrolytic cell comprising an aluminum cathode and an electrolyte containing oxygen-bearing anions, and applying a voltage across the anode and cathode whereby an oxide of selected thickness is caused to be formed electrochemically on the aluminum contacts. The maximum thickness of the oxide depends only upon the voltage. The oxide is caused to increase in thickness until the desired resonant frequency is achieved.

Comprehension of the foregoing aspects of the invention is believed to be aided by FIGS. 1–4. FIG. 1 illustrated the essential components of a quartz crystal resonator. The latter comprises a thin quartz plate 2 of circular shape having on one side thereof an aluminum contact which comprises a round section 4 disposed symmetrically with the center of plate 2 and a tab section 6 which extends to the edge of plate 2. A second like aluminum contact having a round section 4A and a tab section 6A is formed on the opposite side of plate 2. A header assembly 8 is employed to mount the crystal unit. The header assembly 8 is of conventional design and comprises a metallic frame 10 which surrounds and is secured to a round or polygonal plate 12 made of glass, ceramic or other insulating material. Embedded in and extending through plate 12 are two conductive wire leads 14 and 14A and conductively attached to the upper ends of these leads are two conductive metal wire terminals 16 and 16A whose upper ends are formed with open loops 18. In practice the quartz plate is mounted to the header assembly by conductively securing the loops of terminals 16 and 16A to contact tab sections 6 and 6A respectively. This may be done by soldering, welding or brazing or by means of a conductive cement as preferred. In practice the crystal unit is encapsulated by means of a cover (not shown) which is slipped over the crystal unit and sealed to metal frame 10. Adjustment of the frequency of the crystal unit by this invention is accomplished after the aluminum contacts have been plated onto the quartz plate 2 and after the latter is attached to the header assembly. Frequency adjustment by this invention also may be accomplished before the crystal unit is attached to the header assembly, but this approach is not used because it is less covenient than the preferred procedure.

FIG. 2 illustrates how anodic oxidation of the same crystal unit is accomplished. The tab sections 6 and 6A of the two aluminum contacts are connected together by leads 14 and 14A which in turn are connected to the positive terminal of a variable d.c. power supply 20 that is capable of supplying voltages from 0 to 30 volts and a current of about 100 milliamps. The crystal unit is suspended in a tank 22 filled with an electrolyte 24 that contains oxygen-bearing anions. Also positioned in the electrolyte is an aluminum cathode 26 which is connected by a suitable lead wire to the negative side of the power supply. The voltage is adjusted so that it will cause an oxide layer of the desired thickness to be produced on the two aluminum contacts of the crystal unit.

A number of suitable electrolytes are available for use in anodically oxidizing the aluminum contacts. By way of example but not limitation, the electrolyte may comprise any one of the following: a solution of 100 grams boric acid and 2–30 grams of borax in 1000 cc of water; oxalic acid; a 3% solution of tartaric acid adjusted to a ph of 5.5 with ammonium hydroxide; ammonium phosphate; a 3% solution of ammonium citrate; ammonium pentaborate dissolved in ethylene glycol; and dilute boric acid neutralized with ammonia. Variations of these electrolytes and other electrolytes known to persons skilled in the art also may be used. The essential thing is that the electrolyte must not be one which dissolves aluminum since otherwise a non-porous oxide will not be formed. The preferred electrolyte composition comprises 30 grams of boric acid and 5 grams of borax in 1000 cc of de-ionized water. These electrolytes may be used at room temperature, but higher or lower temperatures also may be acceptable.

The frequency change produced by anodically oxidizing the aluminum contacts is measured by removing the crystal unit from system of FIG. 2 and connecting it into a crystal oscillator circuit 30 (FIG. 3) and measuring the oscillator frequency by suitable means such as a frequency counter or meter 32. The oscillator circuit may take various forms and, for example, it may be a simple Pierce oscillator as used in the crystal tester disclosed by J. Markus, Guidebook of Electronic Circuits, p. 930 (see also page 933), McGraw-Hill 1974.

It is to be noted that an oxide film begins to form naturally on the aluminum contacts immediately upon exposure to air after they are deposited onto the crystal. The thickness of this initial oxide layer may not be known at the time that it is taken up for frequency adjustment, and for this reason it is difficult to predict the initial change of frequency that will occur by anodic oxidation. A certain "threshold" voltage must be reached before this initial naturally formed oxide will begin to grow thicker. Once this threshold voltage has been reached, further changes of frequency are strictly porportional to voltage. Hence the voltage applied by the d.c. power supply may be used to adjust the frequency. In this connection it is to be appreciated that the time required for the anodic oxide film to grow in thickness appears to be approximately proportional to the square of the applied voltage. Thus a film having a thickness of about 70Å is formed by a voltage of 5 volts in about 10 seconds, while a film having a thickness of about 280Å is formed by a voltage of 20 volts in about 30 seconds. About 75% of the thickness of the 5-volt film is formed in the first second and about 75% of the 20-volt film is formed in about 5 seconds. Because of the time and the relatively large current involved, it is not practical to develop oxide films having thicknesses much greater than about 300Å. This thickness, however, is six times the thickness required to reduce any subsequent naturally occurring oxidation and attendant aging to a negligible level.

FIG. 4 provides a family of curves representing the experimentally determined changes of frequency ($\Delta f$) of a 47 mhz quartz crystal unit against the time (seconds) for different anodizing voltages.

As an example of the invention, a 47 mhz AT-cut quartz crystal plate is plated with aluminum contacts so as to have a frequency in the range of from about 10 khz above nominal to about 40 khz below nominal. If the frequency after plating is above nominal, the frequency is reduced to the nominal value by anodic oxidation as above described using a voltage of 20 volts. If the initial frequency after the aluminum contacts have been applied is below nominal, the frequency is increased chemically by etching with a dilute solution of NaOH to a value between about 2.5 and 10.0 khz above the nominal frequency, and thereafter the frequency is reduced to the nominal value by anodic oxidation as above described. In either case the crystal unit is thoroughly washed using ultrasonic agitation after the frequency has been adjusted and before final encapsulation.

Further by way of explanation and exemplification, the following calculations apply to an AT-cut quartz resonator operating at a frequency of approximately 47 mhz on the third mechanical overtone. First of all, a change of thickness of 100Å in the thickness of the plate causes a change of 4.056 khz in the resonant frequency. A layer of quartz having a thickness of 100Å has a specific mass of 2.65 micrograms per square centimeter. Therefore the addition of $1.32 \times 10^{-6}$ g/cm$^2$ to each side of the blank causes the frequency to decrease 4.0 khz.

The mass of an oxygen atom is $2.7 \times 10^{-23}$ g and therefore, to obtain a frequency decrease of 4.0 khz, it is necessary to add $1.32 \times 10^{-6}$ g/cm$^2 \div 2.7 \times 10^{-23}$ g/atom = $4.9 \times 10^{16}$ atoms/cm$^2$ to each surface. These oxygen atoms combine with aluminum atoms to form aluminum oxide (Al$_2$O$_3$). Since 3 atoms of oxygen are required to form 1 molecule of Al$_2$O$_3$, it follows that $1.6 \times 10^{16}$ molecules of Al$_2$O$_3$ are produced, each having a mass of $19.1 \times 10^{-23}$ g. The specific mass of the aluminum oxide which is produced is therefore $3.1 \times 10^{-6}$ g/cm$^2$ and since the density of aluminum oxide is 3.3 g/cm$^3$, the thickness of the oxide is 93Å.

The result is that the conversion of enough aluminum on both electrodes of the resonator to form layers of oxide having a thickness of 93Å causes a decrease in the frequency of 4.0 khz. Another way of stating the same thing is to say that the creation of a layer of oxide having a thickness of 1Å ($1 \times 10^{-8}$ cm) causes a decrease of 43 hz in the resonant frequency of the resonator.

The creation of a layer of oxide having a thickness of 50Å (on each electrode) causes a decrease of slightly more than 2 khz in the resonant frequency of the resonator. This is the basis for the step in the procedure in which the frequency of each unit is raised at least 2.5 khz above the nominal frequency and then the frequency is lowered by anodic oxidation to the required nominal frequency.

It is of some interest to note that when the frequency of the crystal unit is adjusted (by any process) with an accuracy of 100 hz, the mass added or subtracted from the surface is the equivalent of that of a layer of quartz having a thickness of about 2.5Å. Since one layer of atoms has a thickness of about 5Å, it is equivalent to removing about half of one layer of atoms. It is for this reason that a process such as anodic oxidation is both desirable and convenient for the adjustment of the frequencies of such resonators.

Most of the aging in high quality quartz resonators with aluminum plating is due to the oxidation of the plating. Hence, as expected, crystal units made utilizing the present invention exhibit much less aging than units whose frequency is adjusted by overplating the aluminum with silver or some other metal. FIG. 5 shows the results of a test on a group of quartz crystals; half of the group were adjusted by anodically forming an aluminum oxide film with a thickness in excess of 50Å and the other half were adjusted by overplating with silver. After 100 days at 120° C., the conventionally formed units had changed by more than 50 parts/million whereas the other group had changed by about 10% of that amount. With both sets of crystal units, the initial frequency measurements were made within 2 hours after the units were adjusted to nominal frequency, i.e., no pre-aging cycle was included.

Obviously the invention is not limited to use with quartz crystal resonators for use in oscillator circuits but also may be used for improving quartz crystal filters with aluminum contacts, e.g., monolithic quartz filters, and also crystal units of the type described that comprise a crystal of a material other than quartz. The invention also may be used to adjust the frequency of other devices which are characterized by acoustic wave generation, notably Rayleigh wave or surface resonators (see Fink, supra, pp. 13-76 to 13-79 for acoustic wave amplifiers) and vibrating crystal transducers. Also while the invention is concerned with forming oxides on aluminum contacts, it may be used to form oxides on crystal contacts that are made of some other metal that also tends to oxidize in air.

The method of this invention also may be used to adjust not only the frequency but also the bandwidth of devices such as monolithic crystal filters and surface resonators whose bandwidth can be changed by modifying the mass of their electrodes. Presently, for example, the bandwidth of monolithic crystal filters is adjusted by means of laser modification of its aluminum electrodes. Modifying the electrodes by this invention for the purpose of adjusting bandwidth is a more economical and simple procedure than existing techniques using lasers. The process of this invention is particularly convenient for making adjustments since open and short circuit frequencies and the bandwidth may be adjusted independently and selectively. The frequency and bandwidth of surface resonators also can be adjusted by loading their electrodes.

This invention offers several distinct advantages. First of all, no material other than aluminum and its oxide is required to be applied to a quartz crystal in order to adjust its frequency. This eliminates completely problems such as diffusion of one metal into another, incompatability of different metals, poor adherence of a second metal to aluminum oxide, and discontinuity of acoustic impedances. Secondly the geometry and symmetry of the resonator are not disturbed since all of the contacts get the same treatment (in the usual method of adjusting frequency, silver is applied to one side only of the crystal). This is important since any disturbance of the symmetry of the plating is conducive to undesired spurious modes of vibration. Simple equipment and a minimum of operator skill are required to carry out the process. Also crystal blanks are cleaned as a part of the process of adjusting the frequency and they may be cleaned safely and without harm by ultrasonic means after the frequency has been adjusted. A further advantage is that aging is minimal and predictable. No pre-aging is required so that production time and costs are reduced. The product quality is high and rejects at the final test station are much lower than with prior frequency adjusting techniques since the thickness of the oxide film is proportional to the applied voltage and the anodic oxidation can be used to change the resonant frequency by a predetermined amount. In practice, the time and voltage required to set the frequency of a number of like crystal units is easily determined based upon the foregoing information. One of the most valuable advantages of this invention is the flexibility it provides in the manufacturing of multielectrode devices where the frequencies of the several resonators can be adjusted independently.

Other advantages and possible modifications of the invention will be obvious to persons skilled in the art.

What is claimed is:

1. Method of producing a piezoelectric crystal unit that is resistant to aging and can maintain a predetermined nominal resonant frequency $f_r$ comprising:

providing a piezoelectric crystal unit having at least one aluminum electrode arranged so that said unit has a resonant frequency greater than $f_r$ and so that the aluminum electrode has at least one exposed surface;

making said at least one aluminum electrode of said unit the anode and a separate aluminum body the cathode, respectively, in an electric circuit comprising a D.C. power supply and a liquid electrolyte which surrounds said unit and aluminum body and which contains oxygen-bearing anions and does not dissolve aluminum oxide; and adjusting the voltage output by said power supply to said circuit in accordance with the difference between the resonant frequency of said unit and said predetermined nominal resonant frequency so as to cause an oxide layer to be formed on said at least one electrode by anodic oxidation to a thickness of at least about 50Å to cause said resonant frequency to be stabilized and changed to substantially said nominal frequency and to make said unit resistant to aging.

2. Method of claim 1 where said oxide layer on said at least one electrode has a thickness in the range of from about 50Å to about 300Å.

3. Method of claim 1 wherein said resonator is made with an initial resonant frequency less than $f_r$, and said electrodes are etched to increase the resonant frequency above $f_r$ before said oxide layer is formed on said at least one electrode by anodic oxidation.

4. The method according to claim 1 wherein said unit has at least two aluminum electrodes and an oxide layer is formed on each of said at least two electrodes by anodic oxidation.

5. Method of adjusting the bandwidth of a piezoelectric crystal unit by a selected amount and also making the unit resistant to aging where said unit includes a crystal with at least one aluminum electrode having at least one exposed surface, comprising the steps of:

immersing said unit and an aluminum cathode in an electrolyte which contains oxygen-bearing anions and which does not dissolve aluminum oxide; and providing a voltage between said at least one electrode and said cathode with a polarity such as to cause anodic oxidation of the exposed surface of said at least one electrode, and adjusting said voltage in accordance with the amount by which said bandwidth is to be adjusted so that said anodic oxidation will cause an oxide layer to be formed on said exposed surface to a thickness sufficient to shift the bandwidth by said selected amount to stabilize the frequency of said unit and to make said unit resistant to aging, said voltage being sufficient to form an anodized oxide layer of at least 50Å.

6. A piezoelectric crystal unit that is resistant to aging and can maintain a predetermined nominal frequency having at least one aluminum electrode, said unit being made in accordance with a process comprising:

providing a piezoelectric crystal unit having at least one aluminum electrode arranged so that said unit has a resonant frequency greater than $f_r$ and so that the aluminum electrode has at least one exposed surface;

making said at least one aluminum electrode of said unit the anode and a separate aluminum body the cathode, respectively, in an electric circuit comprising a DC power supply and a liquid electrolyte which surrounds said unit and aluminum body and which contains oxygen-bearing anions and does not dissolve aluminum oxide; and adjusting the voltage output by said power supply to said circuit in accordance with the difference between the resonant frequency of said unit and said predetermined nominal resonant frequency so as to cause an oxide layer to be formed on said at least one aluminum by anodic oxidation to a thickness of at least about 50Å to cause said resonant frequency to be stabilized and changed to substantially said nominal frequency and to make said unit resistant to aging.

7. A piezoelectric crystal unit according to claim 6 wherein said oxide layer has a thickness below about 300Å.

8. A piezoelectric crystal unit in accordance with claim 6, wherein said unit includes at least two aluminum electrodes and an oxide layer is formed on each of said at least two electrodes by anodic oxidation.

9. Method of producing a piezoelectric crystal unit that is resistant to aging and can maintain a predetermined nominal resonant frequency $f_r$ comprising:

providing a piezoelectric crystal unit having at least one aluminum electrode arranged so that said unit has a resonant frequency greater than $f_r$ and so that said at least one aluminum electrode has at least one exposed surface;

adapting said unit for anodic oxidation of its said at least one electrode by (a) connecting the said at least one electrode of said unit to the positive output terminal of a DC power supply, (b) connecting an aluminum cathode to the negative output terminal of the same power supply and (c) suspending the unit and aluminum cathode in an electrolyte which contains oxygen-bearing anions and does not dissolve aluminum oxide; and adjusting the output voltage of said power supply to a predetermined level so that current passes from said supply through said electrolyte, said at least one aluminum electrode and said cathode and causes an oxide layer to be formed on the exposed surface of said at least one electrode by anodic oxidation to a thickness of at least 50Å required to change the resonant frequency of said unit to substantially $f_r$ and make the unit resistant to aging.

10. Method of producing a crystal resonator unit that is resistant to aging and can maintain a predetermined nominal resonant frequency $f_r$ comprising the steps of:

providing a crystal resonator having at least one metal electrode arranged so that said resonator has a resonant frequency greater than $f_r$, and forming an oxide layer on said electrode of a thickness of at least 50Å so as to make the crystal resonator resistant to aging and to permanently stabilize and adjust the resonant frequency of said resonator to substantially $f_r$.

11. The method of claim 10 wherein two separate aluminum electrodes are used as the electrodes for said unit.

* * * * *

UNITED STATES PATENT AND TRADEMARK OFFICE
CERTIFICATE OF CORRECTION

PATENT NO. : 4,130,771

DATED : December 19, 1978

INVENTOR(S) : Virgil E. Bottom

It is certified that error appears in the above—identified patent and that said Letters Patent are hereby corrected as shown below:

Claim 6, line 22, after the word "aluminum" insert the word --electrode--

Signed and Sealed this

First Day of May 1979

[SEAL]

Attest:

RUTH C. MASON
Attesting Officer

DONALD W. BANNER
Commissioner of Patents and Trademarks